United States Patent
Taniguchi et al.

(10) Patent No.: US 11,107,749 B2
(45) Date of Patent: Aug. 31, 2021

(54) HEAT DISSIPATION FIN STRUCTURE AND COOLING STRUCTURE FOR ELECTRIC SUBSTRATE USING THE SAME

(71) Applicant: TOYOTA JIDOSHA KABUSHIKI KAISHA, Toyota (JP)

(72) Inventors: Naotaka Taniguchi, Toyota (JP); Akihiro Ozeki, Chiryu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 92 days.

(21) Appl. No.: 16/274,415

(22) Filed: Feb. 13, 2019

(65) Prior Publication Data
US 2019/0267308 A1 Aug. 29, 2019

(30) Foreign Application Priority Data
Feb. 26, 2018 (JP) .............................. JP2018-031997

(51) Int. Cl.
*H01L 23/467* (2006.01)
*H01L 23/367* (2006.01)
*H02M 1/00* (2006.01)

(52) U.S. Cl.
CPC ........ *H01L 23/467* (2013.01); *H01L 23/3672* (2013.01); *H02M 1/00* (2013.01)

(58) Field of Classification Search
CPC .............. H01L 23/3672; H01L 23/467; H05K 7/20409; H05K 7/20863; H05K 7/20909; H05K 7/20972; F28F 2215/04; F28F 13/08; H02M 1/00
See application file for complete search history.

(56) References Cited

U.S. PATENT DOCUMENTS

| | | | | |
|---|---|---|---|---|
| 3,592,260 A * | 7/1971 | Berger | .................. | H01L 23/467 165/121 |
| 4,715,438 A * | 12/1987 | Gabuzda | ............... | H01L 23/467 165/185 |
| 4,753,290 A * | 6/1988 | Gabuzda | ............... | H01L 23/467 165/185 |

(Continued)

FOREIGN PATENT DOCUMENTS

| | | |
|---|---|---|
| CN | 205921886 U | 2/2017 |
| JP | H10-190268 A | 7/1998 |

OTHER PUBLICATIONS

Partial Translation of Feb. 3, 2020 Chinese Office Action issued in Chinese Patent Application No. 201910133367.3.

*Primary Examiner* — Eric S Ruppert
*Assistant Examiner* — Hans R Weiland
(74) *Attorney, Agent, or Firm* — Oliff PLC

(57) ABSTRACT

A heat dissipation fin structure includes a plurality of fins provided on a surface of a fin base plate. The fins configure a plurality of flow passages in which cooling air that enters from an inlet passes. The fins include a first fin, and an end portion of the first fin on an inlet side is arranged in an intermediate part of a first flow passage that is formed between a pair of the fins. The first flow passage is divided by the first fin into a second flow passage and a third flow passage. An interval between the pair of fins is wider on an outlet side than the inlet side. A sectional area of the first flow passage is substantially equal to a sum of sectional areas of the second flow passage and the third flow passage.

7 Claims, 3 Drawing Sheets

(56) References Cited

U.S. PATENT DOCUMENTS

| | | | | |
|---|---|---|---|---|
| 5,597,034 | A * | 1/1997 | Barker, III | H01L 23/467 |
| | | | | 165/121 |
| 5,828,551 | A * | 10/1998 | Hoshino | H01L 23/467 |
| | | | | 361/697 |
| 6,434,002 | B1 * | 8/2002 | Wei | H01L 23/467 |
| | | | | 123/41.7 |
| 6,847,525 | B1 * | 1/2005 | Smith | H01L 23/467 |
| | | | | 165/80.3 |
| 9,382,914 | B1 * | 7/2016 | Sharfi | F04D 29/582 |
| 10,104,808 | B2 * | 10/2018 | Scharinger | H01L 23/467 |
| 2004/0244947 | A1 * | 12/2004 | Chen | H01L 23/467 |
| | | | | 165/80.3 |
| 2007/0201211 | A1 * | 8/2007 | Loiler | H01L 23/467 |
| | | | | 361/720 |
| 2009/0321046 | A1 * | 12/2009 | Hernon | H01L 23/467 |
| | | | | 165/80.3 |
| 2010/0108292 | A1 * | 5/2010 | Bhunia | H01L 23/467 |
| | | | | 165/80.3 |
| 2010/0170657 | A1 * | 7/2010 | Kaslusky | H01L 23/467 |
| | | | | 165/80.3 |
| 2011/0051370 | A1 * | 3/2011 | Leutwein | H05K 7/20909 |
| | | | | 361/697 |
| 2012/0014064 | A1 * | 1/2012 | St. Rock | H01L 23/467 |
| | | | | 361/697 |
| 2014/0298846 | A1 * | 10/2014 | Taras | H05K 7/20918 |
| | | | | 62/291 |
| 2014/0321054 | A1 * | 10/2014 | Kaefer | H05K 7/20972 |
| | | | | 361/692 |
| 2019/0335621 | A1 * | 10/2019 | Szostek | H05K 7/20409 |

\* cited by examiner

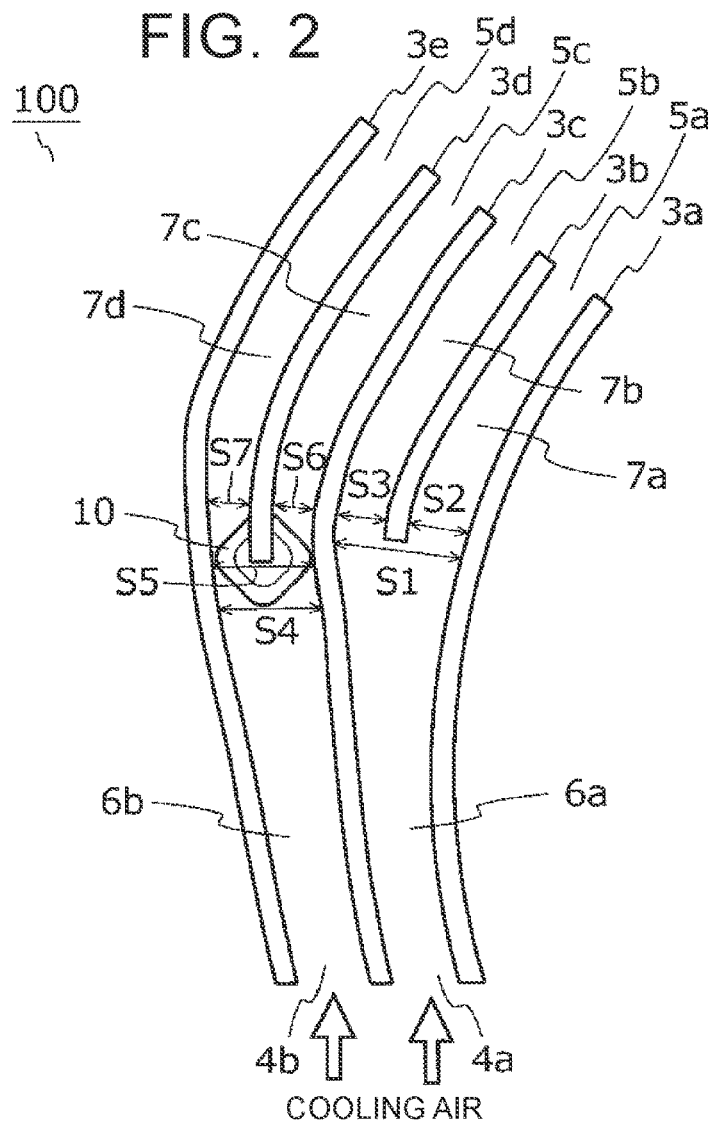
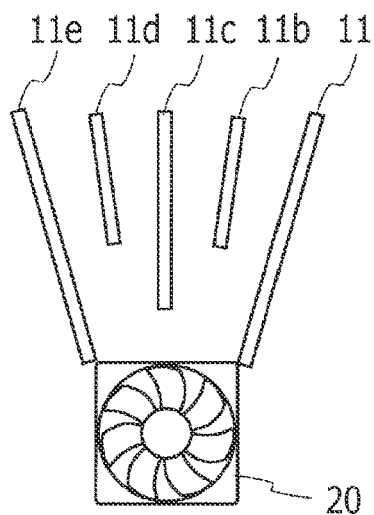
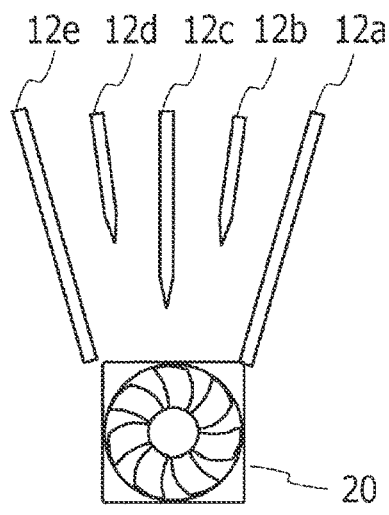
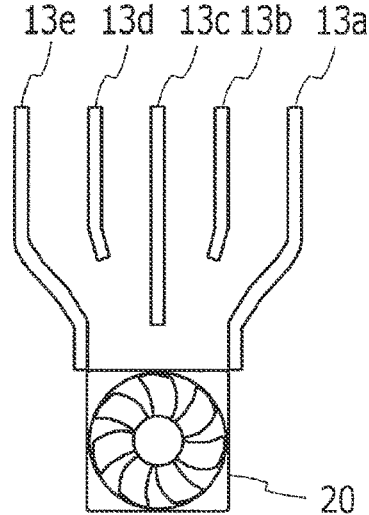

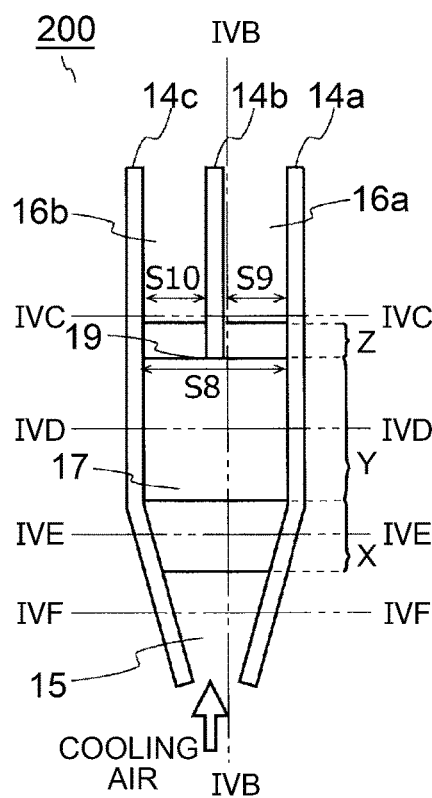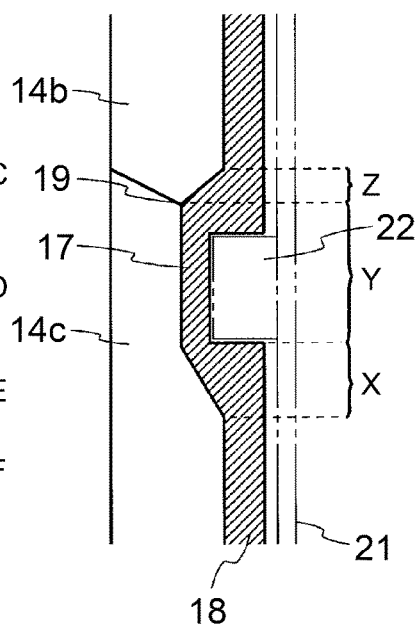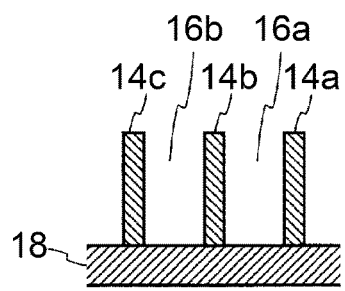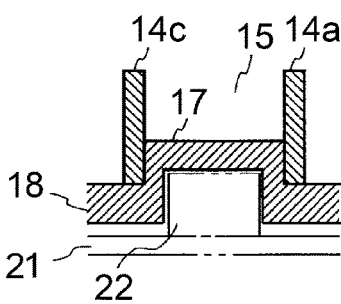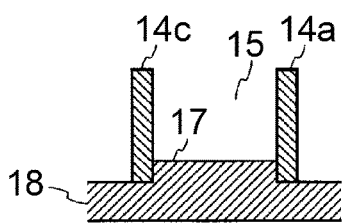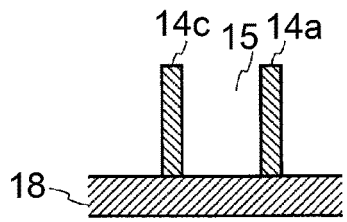

HEAT DISSIPATION FIN STRUCTURE AND COOLING STRUCTURE FOR ELECTRIC SUBSTRATE USING THE SAME

INCORPORATION BY REFERENCE

The disclosure of Japanese Patent Application No. 2018-031997 filed on Feb. 26, 2018 including the specification, drawings and abstract is incorporated herein by reference in its entirety.

BACKGROUND

1. Technical Field

The disclosure relates to a heat dissipation fin structure and a cooling structure for an electronic substrate using the heat dissipation fin structure.

2. Description of Related Art

Japanese Unexamined Patent Application Publication No. 10-190268 (JP 10-190268 A) describes a cooling device for electronic equipment. The cooling device cools down heat of a heat source by using a heat sink and a fan.

SUMMARY

When plate-shaped fins are provided in a housing that houses a large-sized electronic component such as a DC/DC converter, there is room for improvement on shapes of the fins so that the housing with a large heat-generating area is cooled efficiently by using cooling air from a fan.

The disclosure provides a heat dissipation fin structure in which plate-shaped fins are possible to lead cooling air from a fan to a wide area, thus dissipating heat efficiently. The disclosure also provides a cooling structure for an electronic substrate in which the heat dissipation fin structure is used.

A first aspect of the disclosure provides a heat dissipation fin structure including: a fin base plate of which a first surface is thermally connected with a heat source; and a plurality of plate-shaped fins provided on a second surface of the fin base plate. The fins configure a plurality of flow passages in which cooling air that enters from an inlet passes when the cooling air flows towards an outlet, the fins include a first fin, an end portion of the first fin on an inlet side is arranged in an intermediate part of a first flow passage that is formed between a pair of the fins adjacent to the first fin, the first flow passage is divided by the first fin into a second flow passage and a third flow passage in a width direction of the first flow passage, an interval between the pair of fins is wider on an outlet side than the inlet side, and a sectional area of the first flow passage is substantially equal to a sum of sectional areas of the second flow passage and the third flow passage.

According to the first aspect, since an increase in pressure loss at a branching place of the flow passage is restrained, it is possible to lead cooling air to a wide area, and heat is thus dissipated efficiently.

In the first aspect, a projecting portion may be formed on the second surface of the fin base plate at a position inside the first flow passage, and the interval between the pair of fins that forms the first flow passage may increase as a projecting amount of the projecting portion from the fin base plate increases.

With the above configuration, when there is the projecting portion inside the flow passage, a change of a sectional area due to the projecting amount of the projecting portion is reduced. Therefore, an increase in pressure loss is restrained further.

In the above configuration, the end portion of the first fin on the inlet side may be arranged so as to be continuous with the projecting portion.

With the foregoing configuration, the end portion of the fin on the inlet side, the fin branching the flow passage, is arranged so as to be continuous with the projecting portion inside the flow passage without any gap. Therefore, a change of the sectional area near the projecting portion is restrained, thereby further restraining an increase in pressure loss.

In the first aspect, a portion of the first fin in a predetermined range from the end portion on the inlet side may become thinner towards the inlet.

With the configuration, turbulence is restrained from happening in the end portion of the fin on the inlet side, the fin branching the flow passage. Therefore, it is possible to reduce an increase in pressure loss further.

A second aspect of the disclosure provides a cooling structure for an electronic substrate, including: the electronic substrate on which a heater element is implemented; the heat dissipation fin structure according to the first aspect, the heat dissipation fin structure being arranged so as to be superimposed on the electronic substrate with the first surface facing the heater element; and a fan that sends air to the inlet of the heat dissipation fin structure.

According to the second aspect, an increase in pressure loss at the branching place in the flow passage is restrained. Therefore, it is possible to realize the cooling structure for the electronic substrate, the cooling structure being able to lead cooling air to a wide area, thereby dissipating heat efficiently.

A third aspect of the disclosure provides a heat dissipation fin structure, including: a fin base plate of which a first surface is thermally connected with a heat source; and a plurality of plate-shaped fins provided on a second surface of the fin base plate. The fins configure a plurality of flow passages in which cooling air that enters from an inlet passes when the cooling air flows towards an outlet, an end portion of at least one of the fins on an inlet side is arranged in an intermediate part of a first flow passage that is formed between a pair of the fins, the first flow passage is divided by the at least one of the fins into two or more flow passages in a width direction of the first flow passage, an interval between the pair of fins is wider on an outlet side than the inlet side, and a sectional area of the first flow passage is substantially equal to a sum of sectional areas of the two or more flow passages.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 2 is a plan view of the heat dissipation fin structure shown in FIG. 1;

FIG. 3A is a schematic view of an arrangement example of fins, the example being applicable to the heat dissipation fin structure according to the first embodiment;

FIG. 3B a schematic view of an arrangement example of the fins, the example being applicable to the heat dissipation fin structure according to the first embodiment;

FIG. 3C is a schematic view of an arrangement example of the fins, the example being applicable to the heat dissipation fin structure according to the first embodiment;

FIG. 4A is a schematic view of a heat dissipation fin structure according to a second embodiment;

FIG. 4B is a schematic sectional view taken along the line IVB-IVB in FIG. 4A;

FIG. 4C is a schematic sectional view taken along the line IVC-IVC in FIG. 4A;

FIG. 4D is a schematic sectional view taken along the line IVD-IVD in FIG. 4A;

FIG. 4E is a schematic sectional view taken along the line IVE-IVE in FIG. 4A; and FIG. 4F is a schematic sectional view taken along the line IVF-IVF in FIG. 4A.

DETAILED DESCRIPTION OF EMBODIMENTS

Outline

Figure 1:
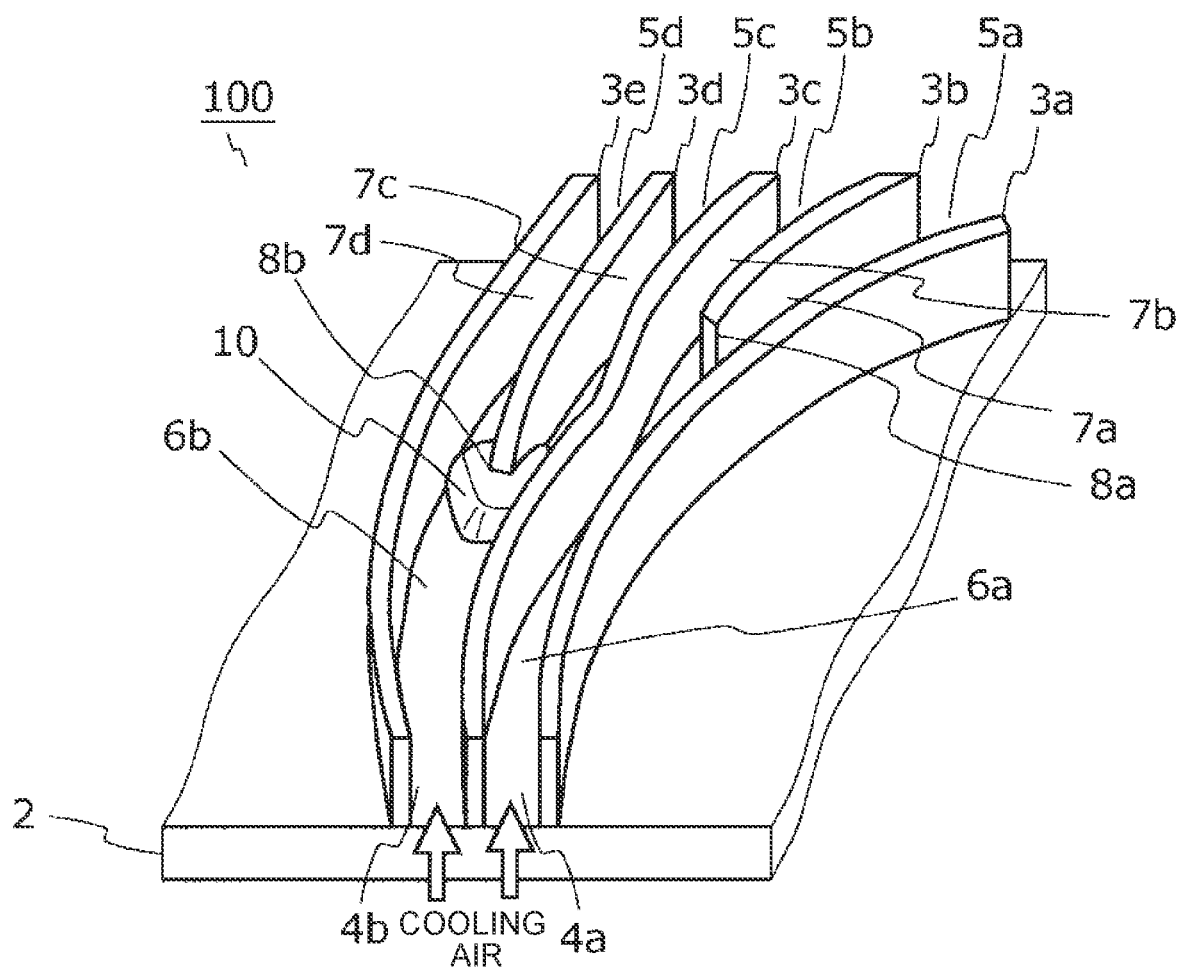
FIG. 1 is a perspective view of a schematic configuration of a heat dissipation fin structure according to a first embodiment.

In a heat dissipation fin structure according to the disclosure, a width of a flow passage formed between a pair of plate-shaped fins is increased towards an air outlet side from an air inlet side. At the same time, another plate-shaped fin is provided between the plate-shaped fins so that the flow passage is branched. Thus, an area of a region where the plate-shaped fin is provided is increased. A sectional area of the flow passage before the branching is substantially equal to the sum of sectional areas of two flow passages formed after the branching. Thus, it is possible to restrain an increase in pressure loss at a branching place.

First Embodiment

FIG. 1 is a perspective view of a schematic configuration of a heat dissipation fin structure according to a first embodiment, and FIG. 2 is a plan view of the heat dissipation fin structure shown in FIG. 1.

A heat dissipation fin structure 100 is a member that is used to dissipate heat from a heater element (not shown) implemented in an electronic substrate. The heat is dissipated through cooling air that is sent from a fan (not shown). The embodiment describes an example where the heat dissipation fin structure 100 is a part of a housing of the electronic substrate. However, the heat dissipation fin structure 100 may be separated from the housing.

The heat dissipation fin structure 100 includes a fin base plate 2 and a plurality of plate-shaped fins 3a, 3b, 3c, 3d, 3e. The fin base plate 2 is an substantially flat plate-shaped member that configures the housing of the electronic substrate. On a surface (an upper surface in FIG. 1) of the fin base plate 2, the fins 3a, 3b, 3c, 3d, 3e are provided. Also, a heat source of the heater element and so on is thermally connected with a back surface (a lower surface in FIG. 1) of the fin base plate 2. The fin base plate 2 and the fins 3a, 3b, 3c, 3d, 3e are formed integrally with each other by using, for example, resin with high heat dissipation. However, either or both the fin base plate 2 or/and the fins 3a, 3b, 3c, 3d, 3e may be formed by using a material other than resin, such as metal.

The fins 3a, 3b, 3c, 3d, 3e are arranged at given intervals between their surfaces facing each other. As the fins 3a, 3b, 3c, 3d, 3e are arranged at given intervals, a plurality of flow passages is configured so that air supplied by a fan (not shown) from inlets 4a, 4b is led to outlets 5a, 5b, 5c, 5d.

The fin 3b is arranged between the fins 3a, 3c, and an end portion 8a of the fin 3b on an inlet side is positioned in the middle of a flow passage 6a that is formed between the fins 3a, 3c that are adjacent to the fin 3b. With this arrangement of the fin 3b, the flow passage 6a formed between the fins 3a, 3c is branched into two flow passages 7a, 7b. Similarly, the fin 3d is arranged between the fins 3c, 3e, and an end portion 8b of the fin 3d on the inlet side is positioned in the middle of a flow passage 6b that is formed between the fins 3c, 3e that are adjacent to the fin 3d. As the fin 3d is arranged as such, the flow passage 6b formed between the fins 3c, 3e is branched into two flow passages 7c, 7d.

In the heat dissipation fin structure 100 according to the embodiment, each of the flow passages 6a, 6b formed by the fins 3a, 3c, 3e is branched. In addition, a width of the flow passage 6a between the fins 3a, 3c and a width of the flow passage 6b between the fins 3c, 3e are made wider on the outlet side compared to the inlet side so as to expand an area where the fins 3a, 3b, 3c, 3d, 3e are arranged. By branching the flow passage made by the fins 3a, 3e and increasing the widths of the flow passages, it is possible to lead cooling air to a wider area on the fin base plate 2.

In places where the flow passages 6a, 6b are branched, respectively, pressure loss happens. However, in the heat dissipation fin structure 100 according to the embodiment, a sectional area of the flow passage before being branched by the fin is substantially equal to the sum of sectional areas of the two flow passages after being branched by the fin. Thus, an increase in pressure loss is restrained. It is preferred that a difference is as small as possible between the sectional area of the flow passage before being branched and the sum of the sectional areas of the two flow passages after being branched, and it is most preferred that there is no difference between them.

Specifically, as shown in FIG. 2, a sectional area 51 of the flow passage 6a before being branched by the fin 3b is substantially the same as the sum of a sectional area S2 of the flow passage 7a and a sectional area S3 of the flow passage 7b. In other words, a sectional area 51 of the flow passage 6a at a region adjacent to an end of the fin 3b on the inlet side, is substantially the same as the sum of a sectional area S2 of the flow passage 7a and a sectional area S3 of the flow passage 7b at a region adjacent to the end of the fin 3b on the inlet side. The flow passages 7a, 7b are obtained as the flow passage 6a is branched by the fin 3b. The sectional area 51 can become substantially equal to the sum of the sectional areas S2, S3 by expanding the interval between the fins 3a, 3c at a position of the end portion 8a of the fin 3b on the inlet side.

Further, as shown in FIG. 1 and FIG. 2, inside the flow passage 6b between the fins 3c, 3e, a projecting portion 10 is present, projecting from a flat surface portion of the fin base plate 2. The projecting portion 10 is formed corresponding to a projecting shape of a component that is implemented on the electronic substrate arranged on a back surface side of the fin base plate 2. In the heat dissipation fin structure 100 according to the embodiment, when the projecting portion 10 is present inside the flow passage 6b, an interval between the fins 3c, 3e is expanded at a position of the projecting portion 10. Thus, a sectional area S4 on the inlet side of the projecting portion 10 becomes substantially equal to a sectional area S5 on the projecting portion 10. Thus, an increase in pressure loss at the position of the projecting portion 10 is restrained. The end portion 8b of the fin 3d on the inlet side is arranged so as to be continuous with the projecting portion 10. The state where the end portion 8b of the fin 3b is continuous with the projecting portion 10 means a state where the end portion 8b of the fin 3b and the projecting portion 10 are in contact with each other without any gap between them in the direction along the flow passage 6b. If there is a gap between the end portion 8b of the fin 3b and the projecting portion 10 in the direction along the flow passage 6b, the sectional area of the flow passage 6b increases and decreases, causing a possible increase in pressure loss. In the embodiment, because the end portion 8b of the fin 3d on the inlet side is continuous with the projecting portion 10, an increase and a decrease in the sectional area of the flow passage 6b is restrained, thereby restraining an increase in pressure loss. Further, the sectional area S5 of the flow passage 6b before being branched by the fin 3d is substantially the same as the sum of a sectional area S6 of the flow passage 7c and a sectional area S7 of the flow passage 7d. The flow passages 7c, 7d are formed as the flow passage 6b is branched by the fin 3d. The sectional area S5 can become substantially equal to the sum of the sectional areas S6, S7 by expanding the interval between the fins 3c, 3e at the position of the end portion 8b of the fin 3d on the inlet side, or on the outlet side of the position.

In the specification, when a flow passage (a primary flow passage) formed by a pair of fins is regarded as a first flow passage, flow passages (secondary flow passages) that are formed as the first flow passage is branched in a width direction by a fin provided inside the first flow passage correspond to second and third flow passages, respectively. In the embodiment, when the flow passage 6a is the first flow passage, the flow passages 7a, 7b correspond to the second and third flow passages, respectively. Further, when the flow passage 6b is the first flow passage, the flow passages 7c, 7d correspond to the second and third flow passages, respectively. When each of the flow passages made by the branching is further branched by a fin, the flow passage to be branched further is regarded as the first flow passage (the primary flow passage), and it is preferred that, before and after the branching, a sectional area of the first flow passage becomes substantially equal to the sum of sectional areas of the second and third flow passages (the secondary flow passages) that are made by the further branching.

FIG. 3A to FIG. 3C are schematic views of arrangement examples of fins applicable to the heat dissipation fin structure according to the first embodiment.

FIG. 3A shows an arrangement example in which a plurality of plate-shaped fins 11a, 11b, 11c, 11d, 11e is arranged around a fan 20. In the example of FIG. 3A, a flow passage between the fins 11a, 11e is divided by the fin 11c. A flow passage between the fins 11a, 11c is divided by the fin 11b, and a flow passage between the fins 11c, 11e is divided by the fin 11d. In the arrangement example of the fins 11a, 11b, 11c, 11d, 11e shown in FIG. 3A, a sectional area of a flow passage before being divided by a fin is substantially equal to the sum of sectional areas of two flow passages after the division by the fin. Thus, an increase in pressure loss at a branching place is restrained.

FIG. 3B shows an example in which end portions of fins 12b, 12c, 12d on an inlet side (a fan 20 side) have a wedge shape. The fins 12b, 12c, 12d branch flow passages between fins 12a, 12e. In each of the fins 12b, 12c, 12d, a portion in a given range from the end portion on the inlet side becomes thinner towards the inlet side. As the fins 12b, 12c, 12d that branch the flow passages have the end portions on the inlet side with the wedge shape, turbulence is restrained from happening, thereby restraining an increase in pressure loss at the branching places.

FIG. 3C shows an arrangement example in which fins 13a, 13b, 13c, 13d, 13e are arranged so that widths of flow passages increase at branching places of the flow passages. In the example in FIG. 3C, an interval between the fins 13a, 13e is increased at a place where a flow passage is branched by the fin 13c. Also, a width between the fins 13a, 13c is increased at the place where the flow passage is branched by the fin 13b, and a width between the fins 13c, 13e is increased at the place where the flow passage is branched by the fin 13d. As the widths of the flow passages are increased at the places where the flow passages are branched as described above, it is possible to restrain an increase in sectional areas of the flow passages from the inlet to the outlet in comparison to the arrangement example shown in FIG. 3A. Therefore, it is possible to further restrain an increase in pressure loss In the arrangement example shown in FIG. 3B and FIG. 3C, a sectional area of a flow passage before being divided by a fin is substantially equal to the sum of sectional areas of two flow passages formed after the division by the fin. Thus, an increase in pressure loss at the branching places is restrained.

With the arrangement examples shown in FIG. 3A to 3C, it is possible to lead cooling air from the fan 20 to a wide range while restraining an increase in pressure loss. Therefore, it is possible to achieve efficient cooling.

Effects Etc.

When a housing that houses a large-sized electronic component such as a DC/DC converter is cooled, a configuration can be employed where a plurality of pin fins is provided on a housing surface, and heat dissipation from the fin pins is promoted by using an axial fan that expels cooling air in a rotation axis direction of the fan. However, in a cooling device in which the pin fins and the axial fan are combined, it is necessary to use a large-sized fan that generates a large volume of air.

Meanwhile, there is also known a configuration in which a plurality of plate-shaped fins is arranged on a housing surface, and a blower fan that expels cooling air in a centrifugal direction is used to send air into a flow passage formed between the plate-shaped fins so that heat dissipation from the plate-shaped fins is promoted. However, in the configuration where the general plate-shaped fins and the blower fan are combined, it is difficult to cool a wide area. Therefore, there is room for improvement on shapes of the plate-shaped fins in order to cool a wide area efficiently.

In the heat dissipation fin structure 100 according to the embodiment, a sectional area of a flow passage before being divided by a fin is substantially the same as the sum of sectional areas of two flow passages that are formed with division by the fin. Therefore, an increase in pressure loss at the branching place is reduced. With the heat dissipation fin structure 100 according to the embodiment, it is possible to lead cooling air from a fan to a wide area as the flow passage formed by the plate-shaped fins is branched, while restraining a decrease in cooling efficiency due to pressure loss.

Further, in the heat dissipation fin structure 100 according to the embodiment, when the projecting portion 10 is present inside the flow passage 6b on the fin base plate 2 as shown in FIG. 1 and FIG. 2, the end portion 8b of the fin 3d on the inlet side is arranged so as to be continuous with the projecting portion 10. The fin 3d branches the flow passage 6b. With this arrangement, it is possible to restrain changes of the sectional area of the flow passage 6b near the end portion 8b of the fin 3d. Therefore, it is possible to restrain an increase in pressure loss even when the fin 3d is arranged near the projecting portion 10.

Further, as shown in FIG. 3B, in the fins 12b, 12c, 12d that branch the flow passage, portions in given ranges from their end portions on the inlet side become thinner towards the inlet side. Thus, turbulence is restrained from happening near the end portions of the fins 12b, 12c, 12d. Therefore, an increase in pressure loss is also reduced.

Second Embodiment

FIG. 4A to FIG. 4F are schematic views showing parts of a heat dissipation fin structure according to a second embodiment. More specifically, FIG. 4A is a plan view of a part of the heat dissipation fin structure, FIG. 4B is a sectional view taken along the line IVB-IVB, FIG. 4C is a sectional view at a position along the line IVC-IVC, FIG. 4D is a sectional view at a position along the line IVD-IVD, FIG. 4E is a sectional view at a position along the line IVE-IVE, and FIG. 4F is a sectional view at a position along the line IVF-IVF. In FIG. 4A, a lower side corresponds to an inlet side, and an upper side corresponds to an outlet side.

As shown in FIG. 4A and FIG. 4B, a heat dissipation fin structure 200 according to the second embodiment includes a fin base plate 18 and fins 14a, 14b, 14c provided on the fin base plate 18. In the heat dissipation fin structure 200 according to the embodiment, a projecting portion 17 is present at a position on the fin base plate 18 between the fins 14a, 14c. As shown in FIG. 4B, the projecting portion 17 is formed corresponding to a heater element 22 implemented on a substrate 21.

A projecting amount of the projecting portion 17 from the fin base plate 18 changes depending on a position on a flow passage 15. As shown in FIG. 4A and FIG. 4B, the projecting amount first increases monotonously from an inlet towards an outlet (a section X). Then, the projecting amount remains substantially the same (a section Y), and then decreases monotonously (a section Z). In the second embodiment, a width of the flow passage 15 is changed in accordance with changes of the projecting amount of the projecting portion 17 on the flow passage 15. Thus, a change of a sectional area near the projecting portion 17 is reduced, thereby restraining an increase in pressure loss. Specifically, since the projecting amount of the projecting portion 17 increases monotonously in the section X, the width of the flow passage 15 between the fins 14a, 14c is increased monotonously as well. Thus, the sectional area is restrained from changing.

Further, an end portion 19 of the fin 14b on the inlet side is arranged so as to be continuous with the projecting portion 17, and, similarly to the embodiment described above, a sectional area S8 of the flow passage 15 before being divided by the fin 14b is the same as the sum of a sectional area S9 of a flow passage 16a and a sectional area S10 of a flow passage 16b, the flow passages 16a, 16b being formed after the division by the fin 14b. Therefore, in the heat dissipation fin structure 200 according to the embodiment, an increase in pressure loss at a branching place of the flow passage 15 is restrained.

With the heat dissipation fin structure 200 according to the embodiment, when there is the projecting portion 17 in the flow passage 15 between the fins 14a, 14c, the width of the flow passage 15 is changed in accordance with the shape (the projecting amount) of the projecting portion 17 so that a change of the sectional area of the flow passage 15 becomes small. Thus, it is possible to restrain an increase in pressure loss near the projecting portion 17, thereby further improving cooling efficiency.

Other Modifications

The arrangements and shapes of the fins, the changes of the width of the flow passage between the neighboring fins, and so on described in the embodiments above may be combined arbitrarily. As the foregoing arrangements and shapes of the fins, the changes of the width of the flow passage between the neighboring fins, and so on are combined, it is possible to configure a heat dissipation fin structure that is able to cool a wide area more efficiently.

Each of the embodiments shows an example of a part of the heat dissipation fin structure where a flow passage between two fins is branched once or twice. However, another fin may be arranged in an already branched flow passage so that a flow passage is branched three times or more. Thus, a heat dissipation fin structure is obtained that is able to cool a wider area. A flow passage between a pair of fins may be divided into more than three flow passages at the same time by arranging two or more fins between the pair of fins.

In each of the foregoing embodiments, a planar shape of a flow passage formed by a plurality of fins is specified. However, the planar shape of the flow passage may be designed as appropriate corresponding to arrangement of a heater element to be cooled, a size of a housing, a shape of a fan to be used, and so on.

The heat dissipation fin structure described in the foregoing embodiments may be combined with an electronic substrate on which a heater element is implemented, and a fan. Thus, a cooling structure for the electronic substrate is configured. In this case, a back surface (a surface where no fins are provided) of a fin base plate is faced with the heater element on the electronic substrate, the heat dissipation fin structure and the electronic substrate are superimposed on each other, and the fan is arranged so that cooling air from the fan is sent to an inlet made of a plurality of fins. The back surface of the fin base plate and the heater element only need to be thermally connected with each other, and may be in contact with each other through thermal grease and so on in order to improve thermal conductivity.

The disclosure can be used as a heat dissipation structure that uses cooling air from a fan in order to dissipate heat from a heater element implemented on an electronic substrate.

What is claimed is:

1. A heat dissipation fin structure, comprising:
a fin base plate having a first surface thermally connected with a heat source; and
a plurality of plate-shaped fins provided on a second surface of the fin base plate, wherein
the fins configure a plurality of flow passages through which cooling air that enters from an inlet passes when the cooling air flows in a flow direction toward an outlet,
the fins include a first fin,
an upstream end portion of the first fin on an inlet side of the first fin is arranged in an intermediate part of a first flow passage that is formed between a pair of the fins adjacent to the first fin,
the first flow passage is divided by the first fin into a second flow passage and a third flow passage in a width direction of the first flow passage,
an interval in the width direction between the pair of fins is wider on an outlet side of the first flow passage than on an inlet side of the first flow passage, and
a sectional area of the first flow passage immediately upstream of the upstream end portion of the first fin is the same as a sum of sectional areas of the second flow passage and the third flow passage immediately downstream of the upstream end portion of the first fin, wherein a projecting portion is formed on the second surface of the fin base plate at a position inside the first flow passage, and the interval in the width direction between the pair of fins that forms the first flow passage increases simultaneously with an increase in a projecting amount of an end portion of the projecting portion from the fin base plate along a section of the first flow passage as the section extends in the flow direction of the cooling air.

2. The heat dissipation fin structure according to claim 1, wherein the upstream end portion of the first fin on the inlet side of the first fin is arranged so as to be continuous with the projecting portion.

3. The heat dissipation fin structure according to claim 1, wherein a portion of the first fin in a predetermined range from the upstream end portion on the inlet side of the first fin becomes thinner towards the inlet.

4. A cooling structure comprising:

an electronic substrate on which a heater element is provided;

the heat dissipation fin structure according to claim 1, the heat dissipation fin structure being arranged so as to be superimposed on the electronic substrate with the first surface facing the heater element; and a fan that sends air to the inlet of the heat dissipation fin structure.

5. The heat dissipation fin structure according to claim 1, wherein at least one of (i) a distance between the pair of fins is increased from a location immediately upstream of the upstream end portion of the first fin to a location immediately downstream of the upstream end portion of the first fin, and (ii) a height of the pair of fins is increased from the location immediately upstream of the upstream end portion of the first fin to the location immediately downstream of the upstream end portion of the first fin, so that the sum of the sectional areas of the second flow passage and the third flow passage immediately downstream of the upstream end portion of the first fin is the same as the sectional area of the first flow passage immediately upstream of the upstream end portion of the first fin.

6. A heat dissipation fin structure, comprising:

a fin base plate having a first surface thermally connected with a heat source; and a plurality of plate-shaped fins provided on a second surface of the fin base plate, wherein the fins configure a plurality of flow passages through which cooling air that enters from an inlet passes when the cooling air flows in a flow direction toward an outlet, an upstream end portion of at least one of the fins on an inlet side of the at least one of the fins is arranged in an intermediate part of a first flow passage that is formed between a pair of the fins that are adjacent to the at least one of the fins, the first flow passage is divided by the at least one of the fins into two or more flow passages in a width direction of the first flow passage, an interval in the width direction between the pair of fins is wider on an outlet side of the first flow passage than on an inlet side of the first flow passage, and a sectional area of the first flow passage immediately upstream of the upstream end portion of the at least one fin is the same as a sum of sectional areas of the two or more flow passages immediately downstream of the upstream end portion of the at least one fin, wherein a projecting portion is formed on the second surface of the fin base plate at a position inside the first flow passage, and the interval in the width direction between the pair of fins that forms the first flow passage increases simultaneously with an increase in a projecting amount of an end portion of the projecting portion from the fin base plate along a section of the first flow passage as the section extends in the flow direction of the cooling air.

7. The heat dissipation fin structure according to claim 5, wherein at least one of (i) a distance between the pair of the fins is increased from a location immediately upstream of the upstream end portion of the at least one fin to a location immediately downstream of the upstream end portion of the at least one fin, and (ii) a height of the pair of the fins is increased from the location immediately upstream of the upstream end portion of the at least fin to the location immediately downstream of the upstream end portion of the at least one fin, so that the sum of the sectional areas of the two or more flow passages immediately downstream of the upstream end portion of the at least one fin is the same as the sectional area of the first flow passage immediately upstream of the upstream end portion of the at least one fin.

* * * * *